United States Patent [19]

Ehni

[11] Patent Number: 4,808,861
[45] Date of Patent: Feb. 28, 1989

[54] INTEGRATED CIRCUIT TO REDUCE SWITCHING NOISE

[75] Inventor: George J. Ehni, Dallas, Tex.

[73] Assignee: Texas Instruments Incorporated, Dallas, Tex.

[21] Appl. No.: 901,918

[22] Filed: Aug. 29, 1986

[51] Int. Cl.$^4$ .................... H03K 17/687; H03K 5/13
[52] U.S. Cl. .................... 307/579; 307/594; 307/303; 307/544; 357/23.14; 357/46; 357/41
[58] Field of Search ............... 307/303, 571, 544, 596, 307/579; 357/59 F, 59 G, 23.14, 41, 46

[56] References Cited

U.S. PATENT DOCUMENTS

| | | | |
|---|---|---|---|
| 3,544,962 | 12/1970 | Thompson | 307/596 |
| 3,823,386 | 7/1974 | Gilbert | 307/303 |
| 3,851,185 | 11/1974 | Hatsukano et al. | 307/470 |
| 4,103,188 | 7/1978 | Morton | 307/300 |
| 4,152,717 | 5/1979 | Satou et al. | 357/23.1 |
| 4,335,405 | 6/1982 | Sakane et al. | 357/30 I |
| 4,423,431 | 12/1983 | Susaki | 357/59 F |
| 4,462,041 | 7/1984 | Glenn | 357/23.14 |
| 4,508,981 | 4/1985 | Dorlen et al. | 307/303 |
| 4,509,067 | 4/1985 | Minami et al. | 357/13 |
| 4,593,205 | 6/1986 | Bass et al. | 307/303 |
| 4,725,747 | 2/1988 | Stein et al. | 307/579 |

FOREIGN PATENT DOCUMENTS 163532 8/1985 Japan .

Primary Examiner—John S. Heyman
Attorney, Agent, or Firm—Larry C. Schroeder; Leo N. Heiting; Melvin Sharp

[57] ABSTRACT

A transistor (14) having a plurality of sub-transistors (29a-f) includes a voltage controlling device (45). The voltage controlling device induces a current through an elongated gate (24) producing a voltage drop across the elongated gate (24) by providing a path between the gate and ground (32). The voltage drop across the elongated gate (24) sequentially reduces the gate voltage present at each of the sub-transistors (29a-f), thereby reducing the amount of current which the sub-transistors (29a-f) can conduct. The voltage controlling circuit (45) gradually reduces the current through the gate (24), thereby increasing the amount of current flowing through the sub-transistors (29a-f). The limiting of current through the output transistors (29a-f) for a predetermined time interval reduces the generation of output noise by controlling the rate at which current is changing in that output.

10 Claims, 2 Drawing Sheets

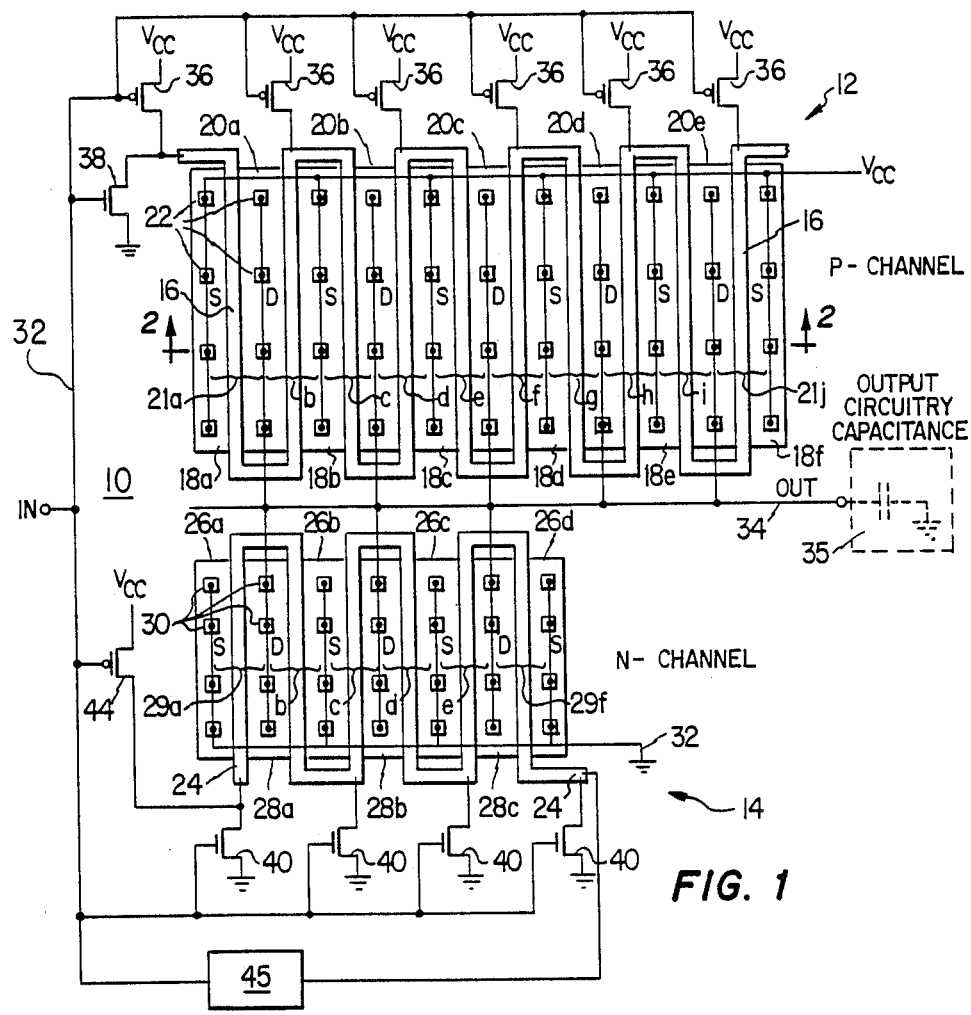
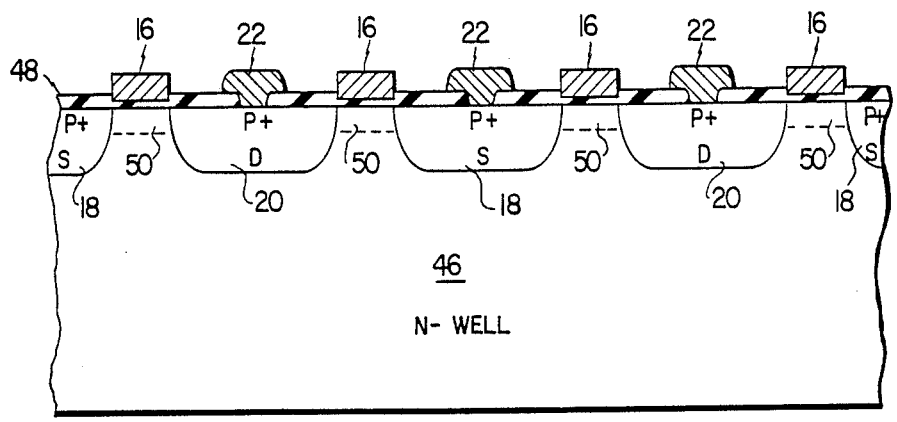
FIG. 1
FIG. 2

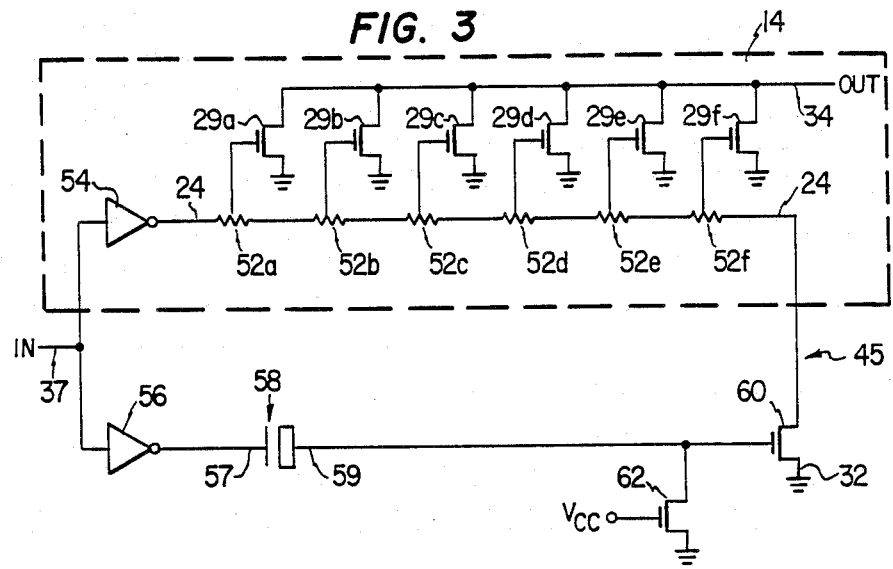
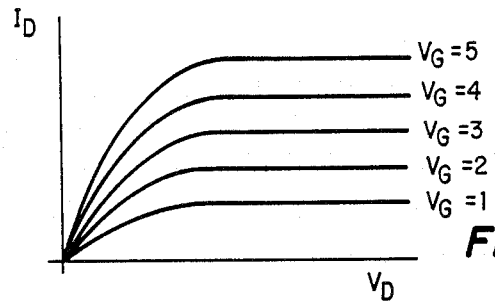
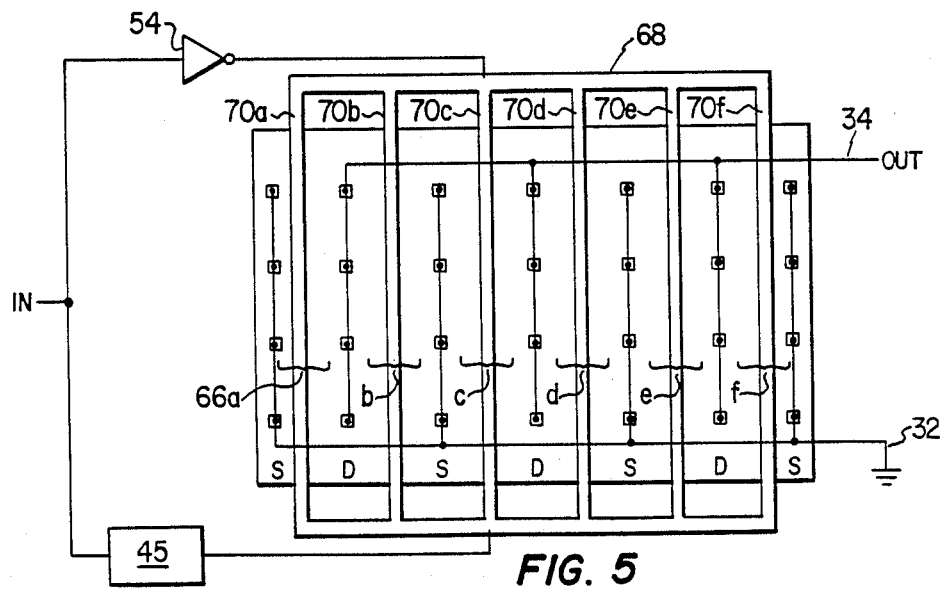

4,808,861

INTEGRATED CIRCUIT TO REDUCE SWITCHING NOISE

TECHNICAL FIELD OF THE INVENTION

This invention pertains in general to integrated circuits, and more particularly relates to reducing output noise of digital integrated circuits.

RELATED APPLICATIONS

"Integrated Circuit Distributed Geometry To Reduce Circuit Noise", by Steven Edward Marum, James Craig Spurlin, Dale Philip Stein, and Sam Max Weaver, Ser. No. 902,267, filed Aug. 20, 1986, issued as U.S. Pat. No. 4,725,747 on Feb. 16, 1988.

"Integrated Circuit to Reduce Switching Noise", by Dale Philip Stein Ser. No. 901,919, filed Aug. 29, 1986.

"Integrated Circuit to Reduce Switching Noise", by George Ehni, et al, Ser. No. 018,871, filed Feb. 24, 1987.

BACKGROUND OF THE INVENTION

Advancement in integrated circuit technology has lead to vast improvements in the speed of integrated circuits, i.e. the time in which the output of a circuit reacts in response to a new input increasing integrated circuit speed has resulted in faster rise and fall times of the output voltages. Similarly, the fast rise and fall times of the output voltages have resulted in abrupt transitions of output current.

While faster speeds are very desirable, the abrupt transition of output currents has created serious problems. The package which holds an integrated circuit device has metallic leads which allow interconnection of the device on a circuit board Each lead has a small parasitic inductance associated with it. The leads are connected to the integrated circuit using bonding wire, which also has a parasitic inductance associated with it. Voltage is related to inductance and the time rate of change of current by the equation $E = L \cdot di/dt$, where $L$ is the measure of inductance and $di/dt$ is the change in current with respect to time The abrupt transition of output currents creates a large change of current at the ground and power supply leads and in the bonding wire, resulting in ground and power supply voltage spikes. These voltage spikes affect the output voltages of the device, and cause output ringing, ground bounce, and false signals.

Systems have been heretofore developed which attempt to alleviate this problem by reducing the amount of inductance (L) present at the leads. One method provides multiple power supply and ground leads in order to reduce the inductance (L) that generates the voltage spikes. However, the reduction in inductance is often insufficient to eliminate voltage spikes at the output of many devices, and may necessitate using a larger package to carry the same integrated circuit.

Another method attempts to reduce the effect of the voltage spikes by bifurcating the surge of current through the lead inductances of the package. The large pull-down transistor in the standard CMOS buffer is split into two devices separated by a resistor. The resistor delays the turn-on of the second device so that the circuit produces two smaller current spikes rather than one large current spike. While somewhat slowing the edge of the output current transition, this circuit is often insufficient to bring the di/dt term to a value which will eliminate voltage spikes at the power and ground leads.

From the foregoing, it may be seen that a need has arisen for a technique which produces a smooth change of output current with respect to time in response to switching output voltage states, in order to reduce or eliminate voltage spikes. Furthermore, a need has arisen for circuitry capable of protecting against false outputs without substantially increasing the number of devices needed to implement the circuitry.

SUMMARY OF THE INVENTION

In accordance with the present invention, an integrated circuit is provided which substantially eliminates or reduces disadvantages and problems associated with switching noise in prior high speed integrated circuits.

In accordance with another aspect of the invention, a transistor is provided for reducing output switching noise, comprising a substrate having semiconductor areas forming a plurality of transistor regions, and an elongated gate having a predetermined resistance. A signal applied to a first end region of the gate propagates along the length of the gate during a predetermined time interval. Upon application of a signal to the first end of the elongated gate, a conducting device connected to a second end of the gate allows a current between the first and second ends, creating a voltage drop along the gate. The voltage drop across the elongated gate decreases the amount of current which the transistor regions exposed to reduced gate voltage can conduct. Over a predetermined time interval, the amount of current through the conducting device at the end of the elongated gate is reduced, thereby increasing the amount of current which the transistor regions can conduct. The gradual increase of conductivity of the transistor regions reduces the generation of output noise by limiting the rate of change of output current with respect to time.

In accordance with another embodiment of the invention, a transistor is provided for reducing output switching noise, comprising a substrate having semiconductor areas forming a plurality of transistor regions, and a gate having a predetermined resistance. A signal applied to the gate renders the transistor regions conductive simultaneously. A conducting device connected to the gate induces a current through the gate, creating a voltage drop across the gate. The voltage drop decreases the amount of current which the transistor regions can conduct. Over a predetermined interval of time, the amount of current through the gate is reduced, thereby increasing the amount of current which the transistor regions can conduct. The gradual increase of conductivity of the transistor regions reduces the generation of output noise by limiting the rate of change of output current with respect to time.

BRIEF DESCRIPTION OF THE DRAWINGS

For a more complete understanding of the present invention and the advantages thereof, reference is now made to the following description in conjunction with the accompanying Drawings in which:

FIG. 1 illustrates a layout of a circuit implemented in accordance with the present invention in a CMOS chip to reduce abrupt output current transitions with respect to time;

FIG. 2 illustrates a cut-away view of the P-channel transistor illustrated in FIG. 1;

FIG. 3 illustrates a detailed circuit diagram of the invention using an equivalent circuit representation of an output n-channel transistor; with the p-channel transistor omitted for clarity;

FIG. 4 illustrates output characteristic curves for a representative n-channel transistor; and FIG. 5 illustrates an alternative embodiment of the invention.

DETAILED DESCRIPTION OF THE INVENTION

The preferred embodiment of the present invention is best understood by referring to FIG. 1 of the Drawings, like numerals being used for like and corresponding parts of the various Drawings. FIG. 1 illustrates a circuit used to reduce the sharp current transitions in a CMOS device. An output CMOS transistor pair, generally referred to by the reference number 10, includes a P-channel transistor 12 and an N-channel transistor 14.

The P-channel transistor 12 includes a polysilicon serpentine gate 16 disposed between a plurality of elongated P-channel sources 18a-f and elongated P-channel drains 20a-e, forming sub-transistors identified by brackets 21a-j. As may be seen gate 16 is formed of elongated portions which extend parallel to and are situated between the sources and drains, with the elongated portions joined at alternating upper and lower regions thereof by short portions perpendicular to the sources and drains to form a single continuous serially-connected gate for the entire transistor 12. A plurality of metal contacts 22 are formed on each P-channel source 18a-f and P-channel drain 20a-e. The P-channel sources 18a-f are connected to $V_{cc}$ (the positive power supply lead), generally held at plus five volts.

The N-channel transistor 14 also employs a polysilicon serpentine gate 24 separating a plurality of elongated N-channel sources 26a-d and N-channel drains 28a-c, forming sub-transistors identified by brackets 29a-f. Gate 24 is constructed similarly to gate 16 to form a single serially-connected gate for the entire transistor 14. Each of the N-channel sources 26a-d and N-channel drains 28a-c have a plurality of metal contacts 30. The N-channel sources 26a-d are connected to ground.

The output 34 of the output pair 10 is connected to the P-channel drains 20a-e and the N-channel drains 28a-c. A capacitor 35 is shown in phantom to represent the capacitance of the circuitry connected to the output.

A plurality of P-channel pull-up transistors 36 are connected at their gates to the input terminal 37 of the output pair 10. The drains of transistors 36 are connected at successive positions on the P-channel serpentine gates 16 and the sources of transistors 36 are connected to $V_{cc}$. The input 37 is connected to the gate of a N-channel inverting transistor 38 having its source connected to ground and its drain connected to the input of the P-channel serpentine gate 16 and to the drain of the first pull-up transistor 36. Similarly, a plurality of N-channel pull-down transistors 40 is connected with their drains connected to successive points on the N-channel serpentine gate 24, the sources of transistors 40 being tied to ground and their gates connected to the input terminal 37. A P-channel inverting transistor 44 is connected at its gate to the input terminal 37, the source of transistor 44 connected to $V_{cc}$ and its drain connected to the drain of the first pull-down transistor 40 and to the input of the N-channel serpentine gate 24.

It should be noted that while FIG. 1 illustrates a representative output pair 10 of a CMOS device, the relative sizes of the P-channel transistor 12 and the N-channel transistor 14 may vary according to the desired application. Both the size and the number of the sources and drains of the transistors may vary accordingly, without effect on the present invention. Similarly, the number of pull-up transistors 36 and pull-down transistors 40 may also vary depending upon the application. CMOS pair 10 is constructed similarly to known CMOS circuits, except that the serpentine gates 16 and 24 are formed in order to slow down the conduction of the pair in order to reduce or eliminate spikes or noise at the circuit output.

As is known, a P-channel transistor conducts between source and drain when the gate voltage is negative with respect to the source voltage. Therefore, if the source is tied to $V_{cc}$, a P-channel transistor will conduct when a "low" signal is present at its gate and will not conduct when a "high" signal is present at its gate. Conversely, a N-channel transistor will conduct between source and drain when the gate voltage is positive with respect to the source voltage. Thus, if the source voltage of a N-channel transistor is tied to ground, it will conduct when a "high" signal is present at its gate and not conduct when "low" signal is present at the gate. A transistor is "turned-on" if it is in a conducting (low impedance) state, and is "turned-off" if it is in a non-conducting (high impedance) state.

The P-channel transistor 12 is comprised of many sub-transistors 21a-j with their drains and sources connected in parallel. In the illustrated embodiment, the P-channel transistor 12 comprises ten such sub-transistors. For example, the first sub-transistor 21a includes the source 18a, the drain 20a and a leg of the serpentine gate 16 therebetween. The second sub-transistor 21b comprises the drain 20a, the source 18b, and a leg of the serpentine gate 16 therebetween. The last sub-transistor 21j includes the drain 20e, the source 18f and the last leg of the serpentine polysilicon gate therebetween. The sources of each P-channel sub-transistor 21a-j are connected in parallel to $V_{cc}$, while the drains of each sub-transistor 21a-j are connected to the output 34. Similarly, the N-channel transistor 14 includes a plurality of N-channel sub-transistors 29a-f, each characterized by a source and a drain (or a drain and a source) with a leg of the serpentine polysilicon N-channel gate between. The sources of the N-channel sub-transistors 29a-f are connected in parallel to ground 32 and the drains are connected in parallel to the output 34.

In operation of the circuit of FIG. 1, assume that the input 37 to the output pair 10 is initially in a "high" state. The two complimentary pairs comprising transistors 36-38 and 40-44 act as inverters between the input 37 and the beginning of the serpentine gates 16 and 24. Thus, a "low" signal would be present at the gate 16 of the P-channel transistor 12 and at the gate 24 of the N-channel transistor 14. The low signal present at serpentive gates 16 and 24 would result in the P-channel transistor 12 being turned on and the N-channel transistor 16 being turned off. Therefore, in the initial state with a "high" input signal, the output 34 would be high, and the output load capacitance 35 would be fully charged. After the output load capacitor 35 is charged, only a negligible amount of current would exist from $V_{cc}$ to the output 34. With the N-channel transistor 14 turned off, there would be negligible leakage current to ground.

However, as the input 37 switches from a high signal to a low signal, the P-channel transistor 12 will turn off and the N-channel transistor 14 will turn on; thus, the output 34 will switch from a high signal to a low signal. Previously developed CMOS transistors have been designed to charge the entire gate substantially instantaneously, thus turning all the N-channel sub-transistors on simultaneously. This results in a surge of current from the output load capacitor 35 to the ground, which would in turn create a large voltage at the ground node due to parasitic inductance. The change of voltage at ground, which is a reference for all the other voltages in the circuit, would adversely affect the output voltages. Naturally, this problem is compounded when multiple outputs are switching simultaneously.

The circuit of FIG. 1, however, prevents the rush of current through the ground 32 by more gradually draining the output load capacitor 35 as follows. The serpentine polysilicon gates 16 and 24 are essentially distributed RC networks, as will be discussed in more detail below in conjunction with FIG. 2. Thus, the input current will propagate along the N-channel serpentine gate 24 according to a predetermined time interval. As the signal propagates along the serpentine gate path, the voltage will increase along the leg of the serpentine gate 24 between the source 26a and the drain 28a, increasing the voltage across the leg. When a threshold voltage is reached, the first N-channel sub-transistor 29a will begin to turn-on, allowing charge to flow from the output circuitry capacitor 35 to ground therethrough. However, the amount of current which a single sub-transistor can sink is only a fraction of what the N-channel transistor 14 could sink if all its sub-transistors 29a-f were turned on simultaneously. Consequently, the di/dt term attributable to the change in current caused by turning on the first sub-transistor 29a is relatively small in comparison to the change in current attributable to turning on an entire transistor.

As the input current continues to propagate through the N-channel serpentine gate 24, the leg between the first drain 28a and the second source 26b will also reach the threshold voltage, beginning to turn on the second sub-transistor 29b. After the second sub-transistor 29b turns on, more charge will be flowing from the output load capacitor 35 to ground 32, but the incremental change in current will only be the current attributable to the turn-on of the second sub-transistor 29b. Thus, the di/dt term will still be relatively small. The input signal will continue to propagate along the N-channel serpentine gate 24, successively turning on each of the six sub-transistors 29a-f contained in the N-channel transistor 14. The successive turn-on of the sub-transistors may be referred to as "graded" or "graduated" turn-on. The "graded turn-on" of the present invention provides the technical advantage of reducing noise in the output voltage by reducing the peak value of di/dt.

After each sub-transistor 29a-f begins to turn on, there will be a small increase in the current; the di/dt term will increase from zero, but will be smaller in value than if the subtransistors 29a-f had turned on simultaneously. By the time the input signal has propagated through the entire polysilicon gate 24, all six sub-transistors 29a-f will be conducting to the extent permitted by their varying gate voltages. The rate of change of the current with respect to time, however, will have been reduced as each of the six sub-transistors turned on. Thus, the dI/dT factor will be much less than if the entire N-channel transistor 14 turned on at once. This has been found to significantly reduce noise and spikes in the output signal.

After the charge from the output load capacitor 35 has been drained through ground, the current through the ground will once again be practically zero. Likewise, since the P-channel transistor 12 remains turned off, no current will exist from $V_{cc}$ to output 34.

Assuming the input 37 is now changed from low to high, in previously developed P-channel transistors, the entire P-channel transistor would turn on, allowing current from $V_{cc}$ to the output 34, charging the output circuitry capacitor 35. Since the entire P-channel transistor would be turned on at once, there would be an abrupt increase in current from $V_{cc}$ to output 34, causing a large voltage drop to occur at the $V_{cc}$ node, and causing undesirable noise in the output voltage.

However, in the present invention, the low signal present at the input of the P-channel polysilicon gate 16 will propagate along the serpentine gate 16, successively turning on the ten sub-transistors 21a-j comprising the P-channel transistor 12. As each sub-transistor 21a-j is turned on, charge from $V_{cc}$ will flow to the output circuit, thus creating a current from $V_{cc}$ to the output 34. However, as described above, the increase in the rate of flow will occur as each P-channel sub-transistor 21a-j is turned on, limiting the dI/dT term to a relatively small value. Consequently, the noise spike at the $V_{cc}$ node will be greatly reduced, thus providing substantial technical advantages.

The purpose of the pull-up transistors 36 and pull-down transistors 40 is to turn off the sub-transistors 21a-j or 29a-f simultaneously, thereby preventing a short circuit from $V_{cc}$ to ground 32. For example, with the input 37 initially in a high state, all the sub-transistors 21a-j of the P-channel transistor 12 will be turned on. As the input signal changes from high to low, the sub-transistors 29a-f of the N-channel transistor 14 will turn on incrementally and without the pullup (36), sub-transistors 21a-j of the P-channel transistor would turn off incrementally. At some point, sub-transistors of both the P-channel transistor and the N-channel transistor would be conducting simultaneously, resulting in a short from $V_{cc}$ to ground. Naturally, this would cause high currents at both the $V_{cc}$ and ground, resulting in high power dissipation in the device.

The P-channel pull-up transistors 36 serve to turn off all of the sub-transistors 21a-j of the P-channel transistor 12 at once by applying $V_{cc}$ at various points along the P-channel serpentine gate 16. In operation, the pull-up transistors will turn on in response to a low signal at their gates, and apply $V_{cc}$ along the P-channel serpentine gate 16. Thus, in the illustrated embodiment, all the legs of the polysilicon gate 16 will be charged at essentially the same time, resulting in a fast turn off of the P-channel sub-transistors 21a-j.

Likewise, the N-channel pull-down transistors 40a-d will operate to simultaneously turn off the sub-transistors 29a-f of the N-channel transistor 14 whenever a high signal is present at the input 37, preventing a possible short through the latter sub-transistors of the N-channel transistor 14 and the initial sub-transistors of the P-channel transistor 12.

Referring now to FIG. 2, a cross-section of the P-channel transistor 12 is shown to illustrate the source of the resistive-capacitive effect, which resists propagation of a signal along the P-channel serpentine gate 16. The polysilicon gate 16 is known to have predetermined resistance. The sources 18 and drains 20 of the P-channel transistor 12 are shown formed by conventional techniques into a N- well 46. A silicon dioxide layer 48 covers the sources 18, drains 20 and N-well 46. The silicon dioxide layer over the N-well 46 is very thin and is known as the "gate oxide". The metal contacts 22 extend through the silicon dioxide layer 48 and contact the sources 18 and drains 20. Fabrication of transistors 12 and 14 is by conventional techniques and will not thus be described in detail. Conducting channels 50 between the sources and drains are illustrated with dotted lines to show the channels are present only when there is a negative voltage on the gate 16 with respect to the source 18. In the present case, the negative voltage will be present when a source 18 is connected to $V_{cc}$ and its respective leg of the serpentine gate 16 is brought to ground.

While parasitic capacitance exists between the gates 16 and sources 18 and between the gate 16 and the drain 20, the main source of capacitance will be created by the conducting channels 50 and the polysilicon gates 16 acting as conductors, and the thin silicon dioxide layer acting as a dielectric therebetween. Similar structure creates resistance and capacitance in the case of the N-channel transistor 14. The capacitance and resistance of the present circuit thus cause a predetermined time delay in the propagation of the input signal through the serpentine gate.

FIG. 3 illustrates the voltage controlling circuit 45 in conjunction with an equivalent circuit representing the N-channel transistor 14. Sub-transistors 29a–f are illustrated in schematic form with their gates separated by series resistive elements 52a–f to illustrate the resistance of the N-channel serpentine gate 24. The sources of the sub-transistors 29a–f are connected to ground 32 and the drains are connected to the output 34. A first inverter 54 is shown in schematic form to represent the inverter formed by the inverting transistor 44 and the first pull-down transistor 40 of FIG. 1. The input 37 is connected to the first inverter 54 and a second invertor 56. The second inverter 56 is connected to a first terminal 57 of capacitor 58, and a second terminal 59 is connected to the gate of a N-channel shunting transistor 60 and to the drain of a N-channel discharging transistor 62. The drain of the shunting transistor 60 is connected to the end of resistive element 52f which represents the end of the N-channel serpentine gate 24. The source of the shunting transistor 60 is connected to ground 32. The gate of the discharging transistor 62 is connected to $V_{cc}$ and its source is connected to ground 32.

Because an N-channel transistor has much higher current sinking capability than a P-channel transistor of the same size, an output pair, such as the output pair 10 illustrated in FIG. 1, can have a N-channel transistor 14 which is one-third as big as the P-channel transistor 12; thus, the N-channel serpentine gate 24 may have approximately one-third the resistance of the P-channel serpentine gate 16, and produce about one-third of the capacitance. This results in an R-C time constant product which is roughly one-ninth of the R-C time constant product of the P channel transistor 12. Consequently, the effectiveness of the graded turn-on in the N-channel devices may only be about one-ninth as effective as in P-channel devices. The voltage controlling circuit 45 serves to reduce the surge of current through the N-channel transistor 14 by temporarily reducing the capability of the N-channel sub-transistors 29a–f to conduct.

In operation, the voltage controlling circuit 45 limits the current sinking capability of the subtransistors 29a–f by producing a temporary I-R drop across the serpentine gate 24. The I-R drop provides successively lower gate voltages at each of the sub-transistors 29a–f. As will be described more fully in connection with FIG. 4, the amount of current which a transistor can conduct varies with its gate voltage.

A high to low transition of the signal at the input 37 causes a low to high transition of the signal present at the beginning of the serpentine gate 24 and at the first terminal 57 of the capacitor 58. As previously described, the high signal present at the serpentine gate 24 propagates along the gate 24 and sequentially turns the sub-transistors 29a–f on. The capacitor 58 resists changes in the voltage differential between its terminals 57 and 59; therefore, it will raise the voltage at the second terminal 59 to a voltage level approximating the high signal. The high signal present on the second terminal 59 is also present at the gate of the shunting transistor 60, putting it in a conducting state. Hence, the shunting transistor 60 conducts between the end of the serpentine gate 24 and ground 32 causing a current through the serpentine gate 24.

A current through the serpentine gate 24 creates a voltage drop over each of the resistive elements 52a–f. Therefore, each sub-transistor has a gate voltage somewhat less than the sub-transistor preceding it. Since the first sub-transistor 29a would be almost fully turned on, it would be able to sink more current than the last sub-transistor 29f which would conduct relatively little current. By limiting the current through the subtransistors 29a–f, the rate at which current is changing at the ground node is reduced.

While it is desirable to limit the current sinking capability of the sub-transistors 29a–f at the beginning of the output voltage transition, it is also necessary that the N-channel transistor 14 eventually be able to sink current at its maximum capability in order to maintain rated output switching current. Therefore, it is beneficial to inhibit current though the serpentine gate 24 after a predetermined time interval. The purpose of the discharging transistor 62 is to discharge the capacitor 58 by providing a path to ground 32. Discharging transistor 62 has $V_{cc}$ connected to its gate, and is therefore always in a conducting state. As the discharging transistor 62 bleeds the charge off of capacitor 58, the voltage present at the gate of the shunting transistor 60 is reduced; consequently, the amount of current which the shunting transistor 60 can conduct is reduced, and the amount of current flowing through the serpentine gate 24 is also reduced. The reduction in current flowing through the serpentine gate 24 causes a proportional reduction in the voltage drop across the resistor elements 52a–f. The reduction in the voltage drop across the resistive elements 52a–f increases the gate voltage at each of the sub-transistors 29b–f allowing the sub-transistors 29b–f to conduct more current.

The discharging transistor 62 continues to bleed the charge off the capacitor 58 until a near zero voltage is present at the gate of the shunting transistor 60. As the voltage at the gate of the shunting transistor 60 declines, the voltage at the gates of the sub-transistors 29b–f increases; at the point where the shunting transistor 60 is no longer conducting, the voltages at the gates of sub-transistors 29a–f will be equal to the voltage present at the beginning of the serpentine gate 24.

The time interval during which the shunting transistor 60 conducts, i.e., the duration of the voltage drop across the serpentine gate 24, can be adjusted by modifying the relative sizes of capacitor 58 and discharging transistor 62. A larger capacitor holds more charge, and thus takes longer to discharge, while a wider transistor conducts more current, and thus discharges a given capacitor faster. By varying the relative sizes, an appropriate time interval may be obtained.

In the preferred embodiment, the capacitor 58 is formed by connecting the source and drain of a N-channel transistor to form one terminal, with the polysilicon gate used as the other terminal. However, other methods of forming a capacitive element on a integrated circuit are known to those skilled in the art.

FIG. 4 illustrates output characteristic curves for a typical transistor. As can be seen from the curves, the drain current $I_d$ (amount of current which the transistor will conduct) for a given drain voltage $V_d$ increases substantially proportionally with the voltage present at the gate $V_g$. It is this characteristic of a transistor which allows the present invention to provide a smooth current transition in response to a changing output by proportionately decreasing the gate voltage of successive sub-transistors 29a-f in the N-channel transistor 14. This characteristic also accounts for a decrease in current through the resistive elements 52a-f in response to decreasing the signal present on the gate of the shunting transistor 60.

As can be seen in FIG. 5, the present invention can also be used with previous developed transistor configurations in order to reduce abrupt transitions of current through the ground pin 32 caused by switching output signals. A N-channel transistor 64 comprises several sub-transistors 66a-f. A polysilicon parallel-connected gate 68 having legs 70a-f is designed such that, all of the sub-transistors 66a-f will turn-on substantially at the same time. In previously developed transistors, this would cause a large voltage spike at the ground pin 32 as described above. With the addition of the voltage controlling circuit 45, this abrupt current transition can be prevented.

In operation, the voltage controlling circuit 45 allows current flow through the gate 68, inducing an I-R drop across the legs 70a-f, effectively reducing the gate voltage at the sub-transistors 66a-f proportionate to their distance from the driver end of the polysilicon gate. Since the legs 70a-f of the gate 68 are essentially resistors in parallel, each sub-transistor 66a-f operates at the same reduced gate voltage, unlike the circuit of FIG. 3, wherein sequential transistors conduct successively decreasing amounts of current. As the discharging transistor 62 bleeds the charge off the capacitor 58, the voltage drop across the legs 70a-f declines, and the gate voltage to the sub-transistor 70a-f increases until all of the sub-transistors are conducting at their maximum rate. As described above, the size of the discharging transistor 62 may be adjusted in order to obtain an appropriate time interval during which the sub-transistors 66a-f conduct at a reduced rate.

It should be noted that the gate structure FIG. 5 was chosen for simplicity of illustration, whereas many previously developed gate structures may differ substantially. The voltage controlling circuit 45 can work with other gate structures, so long as a voltage drop can be induced along the gate in order to reduce the voltage at the gates of the sub-transistors. For most gate structures, one skilled in the art would be able to place the drain of the shunting transistor 60 so as to produce a voltage drop along the gate.

It should also be noted that while the invention has been illustrated in FIG. 3 and 5 with a N-channel transistor, it could be easily modified to reduce the sharp transition of current in a P-channel transistor, NMOS transistor, bipolar transistor, or a transistor of another technology, by methods known to those skilled in the art.

Thus, the present invention provides advantages as discussed above, as well as numerous other advantages. As will be apparent to those skilled in the art, the present invention can be widely modified and varied. The scope of the invention is not limited, except as set forth in the accompanying claims.

TECHNICAL ADVANTAGES OF THE INVENTION

It is an important technical advantage that the invention may be used to reduce inductive voltages at the power supply and ground nodes of an integrated circuit by reducing the change in current through the nodes with respect to time in response to switching output voltages. It is a further technical advantage that the invention reduces the changing current with respect to time by producing a voltage drop over the gate of a transistor, thus reducing the voltage at the gate of the sub-transistors. It is yet a further technical advantage that the voltages at the gates of the sub-transistors are increased over a predetermined time interval to allow controlled maximum current sinking by all the sub-transistors.

Another technical advantage of the invention is that it may be used with either conventional gate structures which would otherwise turn on all of the sub-transistors simultaneously, or with a serpentine configured gate structures which sequentially turn on the sub-transistors.

Another important technical advantage is that the invention may be used with N-channel, P-channel, bipolar, and other transistors to reduce inductive voltages at the pins of an integrated circuit.

What is claimed is:

1. A transistor circuit comprising:
   a substrate having semiconductor surface areas forming a plurality of transistor regions;
   a gate having a length and a predetermined resistance along said length and being disposed adjacent said semiconductor surface areas such that a gate signal applied to a first end region of said gate propagates along the length of said gate in a predetermined time interval, the propagation of said gate signal along said gate causing conduction of ones of said transistor regions;
   a conducting device connected to a second end region of said gate to allow a transient current to pass from said first end region of said gate through said conducting device to cause a voltage drop across said gate, said voltage drop reducing the amount of current conducted by ones of said transistor regions; and
   a switching device connected to said conducting device, said switching device operable to inhibit or enable current through said conducting device, said switching device comprising a capacitor having first and second terminals said capacitor connected to said conducting device such that said conducting device will conduct in response to a change in said signal on said first terminal.

2. The transistor circuit of claim 1 wherein said conducting device comprises a transistor.

3. The transistor circuit of claim 1 wherein said switching device further comprises restoring device, said restoring device operable to restore a predetermined voltage on said second terminal after a second predetermined time interval such that current flow through said conducting device will be inhibited when said predetermined voltage is present on said second terminal.

4. The transistor circuit of claim 1 wherein said restoring device is a transistor having a source connected to said predetermined voltage and a drain connected to said second terminal.

5. The transistor of claim 1, wherein said gate has a parallel-connected configuration, said gate causing conduction of ones of said transistor regions substantially simultaneously.

6. The transistor of claim 1, wherein said gate has a elongated configuration, said gate causing sequential conduction of ones of said transistor regions.

7. A transistor circuit comprising:
a substrate having a semiconductor surface areas including a plurality of transistor regions;
an elongated gate having a length and a predetermined resistance along said length and being disposed adjacent said semiconductor surface areas in a series configuration such that a gate signal applied to a first end region of said gate propagates along the length of said gate in a predetermined time interval, the propagation of said gate signal along said gate causing sequential conduction of ones of said transistor regions;
a conducting device connected to a second end region of said elongated gate to allow a transient current to pass from said first end region of said gate through said conducting device to cause a voltage drop across said elongated gate, said voltage drop reducing the amount of current conducted by ones of said transistor regions; and
a switching device connected to said conducting device, said switching device operable to inhibit or enable current through said conducting device, said switching device comprising a capacitor having a first and second terminals, said capacitor connected to said conducting device such that said conducting device will conduct a response to a change in said signal on said first terminal.

8. The transistor circuit of claim 7 wherein said conducting device comprises a transistor.

9. The transistor circuit of claim 7 wherein said switching device further comprises a restoring device, said restoring device operable to restore a predetermined voltage on said second terminal after a second predetermined time interval such that current flow through said conducting device will be inhibited when said predetermined voltage is present on said second terminal.

10. The transistor circuit of claim 7 wherein said restoring device is a transistor having a source connected to said predetermined voltage and a drain connected to said second terminal.

* * * * *